United States Patent [19]

Kodama

[11] Patent Number: 5,541,119
[45] Date of Patent: Jul. 30, 1996

[54] MANUFACTURING METHOD OF ACTIVE CIRCUIT ELEMENTS INTEGRATED TYPE LIQUID CRYSTAL DISPLAY

[75] Inventor: Noriyuki Kodama, Tokyo, Japan

[73] Assignee: NEC Corporation, Tokyo, Japan

[21] Appl. No.: 271,785

[22] Filed: Jul. 7, 1994

[30] Foreign Application Priority Data

Jul. 8, 1993 [JP] Japan .................................. 5-193158

[51] Int. Cl.⁶ .............................................. H01L 21/266
[52] U.S. Cl. ............................................ 437/24; 437/937
[58] Field of Search .............................. 437/24, 46, 233, 437/907, 109, 101, 187, 937, 941, 967, 247, 40, 21; 257/59, 72; 359/59

[56] References Cited

U.S. PATENT DOCUMENTS

| | | | |
|---|---|---|---|
| 4,769,338 | 9/1988 | Ovshinsky | 437/39 |
| 4,913,674 | 4/1990 | Nicholas | 430/313 |
| 4,943,837 | 7/1990 | Konishi et al. | 437/937 |
| 5,091,792 | 2/1992 | Kaida | 359/67 |
| 5,141,885 | 8/1992 | Yoshida et al. | 437/41 |
| 5,237,436 | 8/1993 | Khan et al. | 359/59 |
| 5,247,375 | 9/1993 | Mochizuki et al. | 359/54 |
| 5,250,444 | 10/1993 | Khan et al. | 437/24 |
| 5,289,030 | 2/1994 | Yamazaki et al. | 257/410 |
| 5,300,449 | 4/1994 | Okumura | 437/200 |
| 5,313,075 | 5/1994 | Zhang et al. | 257/57 |
| 5,372,958 | 12/1994 | Miyasaka et al. | 437/40 |
| 5,401,685 | 3/1995 | Ha | 437/937 |
| 5,403,756 | 4/1995 | Yoshinouchi et al. | 437/24 |
| 5,403,772 | 4/1995 | Zhang et al. | 437/101 |
| 5,403,782 | 4/1995 | Takemura | 437/40 |

*Primary Examiner*—George Fourson
*Assistant Examiner*—S. Mulpuri
*Attorney, Agent, or Firm*—Popham, Haik, Schnobrich & Kaufman, Ltd.

[57] ABSTRACT

The trap-state density of a switching transistor of a picture element is reduced by selectively treating only the switching transistor of the picture element part of a liquid display with the plasma hydrogenation treatment, the laser annealing treatment or both thereof. That is, aluminum is sputtered before making an aperture for a contact hole of a thin layer transistor, then a mask aluminum is formed on the active circuit element forming region by patterning only aluminum on the picture element forming region. Then, the plasma hydrogenation treatment is made, and the mask aluminum film is removed by the etching. Following the similar process thereafter, an active circuit integrated liquid crystal display is fabricated. Thereby, the leakage current of the switching transistor of the picture element part can be reduced and decrease of pressure tolerance of transistors constituting the active circuit element and the depletion can be prevented.

2 Claims, 5 Drawing Sheets

FIG. IA
(PRIOR ART)
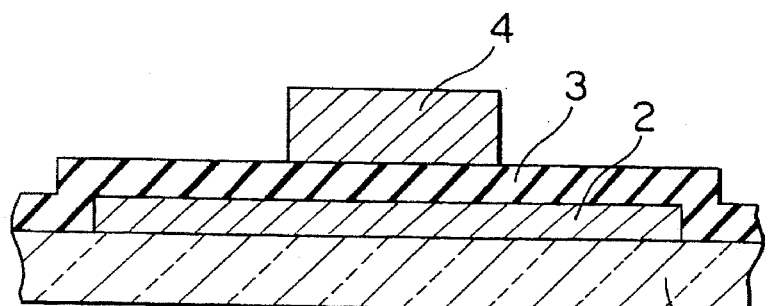
FIG. IB
(PRIOR ART)
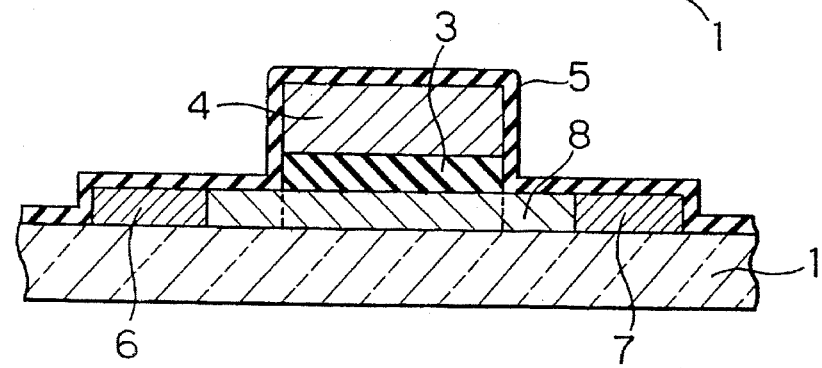
FIG. IC
(PRIOR ART)
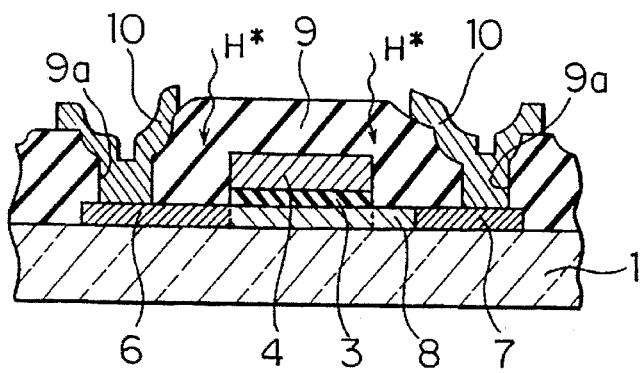
FIG. ID
(PRIOR ART)
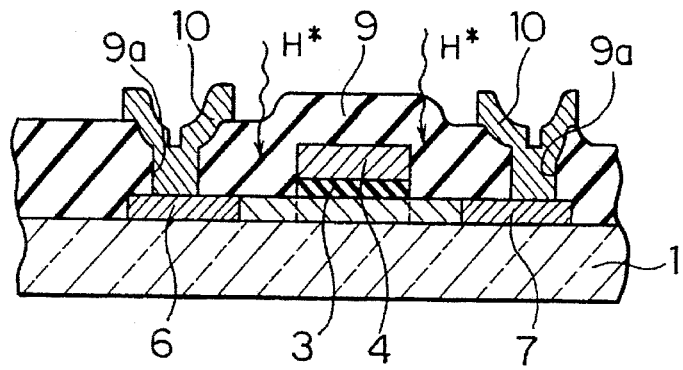

MANUFACTURING METHOD OF ACTIVE CIRCUIT ELEMENTS INTEGRATED TYPE LIQUID CRYSTAL DISPLAY

BACKGROUND OF THE INVENTION

1. Field of the Invention

The present invention relates to a manufacturing method of an active circuit elements integrated type liquid crystal display having an individual switching transistor for each picture element on the same substrate and an active circuit element operating said switching transistor.

2. Prior Art

AV sets and picture processing software with high image quality have been quickly propagated in each home, and together with development of high vision TV sets, the display is in a trend to become wider and finer.

However, CRT direct-view type or CRT projection type TV sets according to the prior art have a defect that they are very large and heavy. Therefore, it is difficult to further expand the size and increase the image quality.

On the other hand, since the projection type liquid crystal display is possible to significantly reduce its weight and size, it has a very bright future as a next generation display unit and its market is considered to steadily increase.

The projection type liquid crystal display projects the image on a screen by radiating light from the light source through a panel controlling the optical transmission. By activating liquid crystal in each picture element provided in said panel using thin-film transistors, the optical transmission of said panel is controlled. In this projection type liquid crystal display, an approach toward high density picture element has been taken to increase image quality, and in the switching transistors to be provided to each picture element, an approach toward low leakage has been taken to maintain current viased to the liquid crystal.

Simplifying the manufacturing process is also important subject for the panel used for this projection type display because of its complicated manufacturing process. To simplify this manufacturing process and reduce manufacturing cost, an approach widely considered is that the circuit elements activating the switching transistors on the picture element part is formed in one-body on the peripheral area of the picture elements on the same chip by the same process or by corresponding process thereof and the mounting process together with external input-output device and a light valve is simplified.

In the liquid crystal light valve according to the prior art, amorphous silicon thin-film transistors have been used as switching transistors in order to reduce a leakage current. However, if the activating circuit elements are integrated on the same substrate, the On-state current must be high for the transistors constituting the active circuit elements and higher On-state current is required for the picture element transistors.

Therefore, an alternative method using polysilicon thin-film transistors having polysilicon channel in which the mobility is higher about two digits than that of the amorphous silicon has been proposed.

Furthermore, in order to further improve the characteristics of the polysilicon thin-film transistors, improvement of the mobility and threshold voltage by the reduction of the trap-state density using methods such as the laser annealing and the plasma hydrogenation and low leakage and high pressure-proof using the off-set gate structure are aimed.

The prior art will be described hereinafter, referring to FIGS. 1A to 1D. FIGS. 1A to 1D are sectional views showing the manufacturing method of transistors constituting the active circuit elements integrated liquid crystal display according to the prior art. FIG. 1A shows the first process and FIG. 1B the second process. FIG. 1C shows the active circuit transistors of the third process and FIG. 1D the picture element switching transistors of the same.

First, as shown in FIG. 1A, amorphous silicon is deposited on a substrate 1 comprising transparent quartz substrate under temperature at about 500° C. and crystallized by heat treatment at 600° C. under nitrogen atmosphere for about 15 hours to form large crystalline polysilicon layer 2 for an active layer.

By this process, grain boundaries in the active layer region can be reduced and the characteristics can be improved. There is another method available to improved the crystallization of the polysilicon layer 2 and subsequently improve TFT characteristics by heat treatment of the polysilicon layer 2 at least 1000° C.

Then, an active layer part comprising the polysilicon layer 2 is formed by the patterning of the polysilicon layer 2, and a gate oxide film 3 is deposited on the whole surface at the thickness of 100 nm using the CVD technique.

As the next step, another polysilicon layer is deposited on the whole surface at the thickness of 200 nm in order to form a gate electrode 4. After phosphorous is diffused on this polysilicon layer, the gate electrode 4 is formed by the patterning.

Subsequently, as shown in FIG. 1B, the oxide film 3 is etched back so as to remain the gate oxide film 3 immediately under the gate electrode 4 and to remove all other part of the gate oxide film 3. Then, a through oxide film 5 is deposited at the thickness of about 30 nm using the CVD technique.

Then, photoresist having openings for formation of a source region and drain region is provided, and using this photoresist as mask, the source region 6 and the drain region 7 are formed by implantation of boron for P-type transistors or phosphorous for N-type transistors.

The withstanding voltage between the source and the drain can be improved and the leakage current can be reduced by providing an off-set region 8 without ion implantation on the drain side in the transistors constituting the picture element switching transistors and the peripheral active circuit elements at this process so as to form the off-set structure. Further improvement of the active circuit elements also can be achieved by forming the LDD structure implanting phosphorous for the N-type or boron for the P-type in the off-set region 8 at the dose of $5\times10^{12}$ cm$^{-2}$, for example.

Then, as shown in FIGS. 1C and 1D, a layer separating film 9 is deposited at the thickness of about 400 nm, for example, and by heat treatment at about 900° C., impurities are activated and the layer separating film 9 is reflowed.

Subsequently, apertures for contacts 9a are formed on the source region 6 and the drain region 7 of the picture elements and the active circuit transistors by the plasma etching, aluminum is sputtered on the whole surface, then an aluminum electrode 10 is formed by the patterning.

After formation of the aluminum electrode 10, the trap-state density of the channel region is reduced by the plasma hydrogenation (IEEE ELECTRON DEVICE LETTERS, Vol. 10, No. 3, March 1989).

Finally, the layer separating film is deposited and flattened, the second aluminum electrode for the data bus line, and a liquid crystal light valve is formed following the liquid crystal enclosure process.

According to the prior art, the manufacturing method based on using transparent quart for the substrate 1. However, in the process using glass for the transparent substrate 1, low-temperature process is unavoidable since the heat tolerance of the substrate is 600° C. or less. Therefore, improvement of crystallization by high temperature annealing can not be used during its manufacturing process. For this reason, high quality polysilicon film is formed by crystallization of amorphous silicon by the laser annealing, aiming improvement of the transistor characteristics.

Next, defects of the prior art shown in FIGS. 1A to 1D will be explained referring FIGS. 2A to 2C. FIGS. 2A to 2C are drawings showing the characteristics of transistors constituting the active circuit elements integrated liquid crystal display according to the prior art before and after the plasma hydrogenation; FIG. 2A shows the drain current-drain voltage characteristics, FIG. 2B shows the drain current-gate voltage characteristics of the N-type transistors and FIG. 2C shows the drain current-gate voltage characteristics of the P-type transistors.

As aforementioned, there are many trap-state density in polysilicon due to crystallization failure and grain boundaries which contribute to lower characteristics.

Heretofore, in order to reduce the trap-state density in polysilicon film and improve the characteristics, plasma hydrogenation has been used.

In transistors of the active circuit elements, as clearly shown by the drain current-drain voltage characteristics in FIG. 2A, the ON-current is improved from 400 µA to 650 µA in the N-type transistors by plasma hydrogenation while the withstanding voltage between the source and the drain lowered from 33 V to 22 V according to improvement of the mobility and reduction of the threshold voltage. The P-type transistors show similar trend.

This can be considered due to the fact that the holes of the electron-hole pair generated at the drain edge of the N-type transistors accumulate at the source edge so that the parasitic bipolar operation which forward viases the P-N junction at the source side can readily occur.

Once the trap-state density is reduced by plasma hydrogenation, generated holes easily accumulate so that reduction of withstanding voltage by the parasitic bipolar operation becomes remarkable. If the gate length is shortened, the ON-current is improved while the withstanding voltage between the source and the drain is reduced.

As conclusion, higher voltage is required for the drain voltage of transistors constituting the active circuit elements compared to the picture element transistors. However, in order to reduce the area of the light valve, the area occupied by the peripheral active circuit elements must be reduced; that is the gate length must be expanded, on the other hand. Therefore, reduction of withstanding voltage becomes significant problem, particularly in the active circuit elements.

As obvious from FIGS. 2B and 2C, the threshold voltage decreases and the subthreshold swing increases, due to reduction of trap-state density of polysilicon in the active layer by plasma hydrogenation.

FIGS. 1A to 1D explain about transistors having the structure of which the P-type transistor is to be the depletion type MOS transistor, however there are some cases the N-type transistor becomes the depletion type transistor because the threshold voltage of the transistor is influenced by the quality of polysilicon film of the channel region, the film quality of the gate oxide film, process conditions and the like. In case of this N-type transistor, if the trap-state density is reduced by plasma hydrogenation and the like, control of the threshold voltage becomes difficult.

In transistors of the picture element part, however, the gate voltage is about −2 V or less at the OFF-state and therefore less influenced by the depletion as mentioned above in the view point of circuit design.

As mentioned above, in transistors constituting the active circuit with relatively high activation voltage, the withstanding voltage between the source and the drain decreases if the TFT characteristics of the substrate formed in one-body with the active circuit elements is improved by plasma hydrogenation and the like to reduce the leakage current of the picture element transistors. Therefore, it is difficult to apply this process to transistors having shorter gate length, and therefore regarding the ON-current the effects of the mobility increase and the decrease of threshold voltage by reduction of the trap-state density offset each other. Furthermore, the size of transistor becomes larger and the area occupied by the transistors becomes wider, which contravene the requirement for reduction of the size of light valve.

Further, there are several cases either the P-type transistor or the N-type transistor comes close to the depletion type and the OFF-current becomes higher by decrease of the threshold voltage and increase of the subthreshold swing, therefore these are significant problems for transistors particularly constituting the active circuit elements.

SUMMARY OF THE INVENTION

The object of the present invention is to provide a manufacturing method of an active circuit integrated liquid crystal display capable of reducing the leakage current and preventing the increase of the OFF-current and the decrease of the withstanding voltage between the source and the drain due to the decrease of threshold voltage of the active circuit transistors.

A manufacturing method of a liquid crystal display having switching transistors for picture elements and an active circuit according to the present invention, comprises the step of selectively reducing the trap-state density of the polysilicon layer constituting an active layer of said switching transistor of the picture element part or pixel region.

In the manufacturing method of the active circuit integrated liquid crystal display according to the present invention, only switching transistors in the picture element part of the liquid crystal display are selectively treated by plasma hydrogenation, laser annealing or both of so as to reduce the trap-state density of the switching transistors of the picture element part or pixel region.

In the present invention, only the switching transistors of the picture element part or pixel region are hydrogenized. Thereby, the threshold control of TFT constituting CMOS becomes easier. Further, the implantation process is not required to control the threshold voltage of TFT constituting CMOS, the process itself can be simplified and the yield is increased.

According to the active circuit integrated liquid crystal display of the present invention, by selectively reducing the trap-state density of the active layer polysilicon of the switching transistors in the picture element part, the transistor characteristics of the picture element part can be improved, decrease of withstanding voltage between the source and the drain of transistors constituting the active circuit elements can be prevented, the depletion can be prevented, and therefore stable active circuit characteristics can be obtained.

BRIEF DESCRIPTION OF THE DRAWINGS

FIG. 1A is a sectional view showing the first step of a conventional manufacturing method of transistors constituting the active circuit integrated liquid crystal display;

FIG. 1B is a sectional view showing the second step of a conventional manufacturing method of transistors constituting the active circuit integrated liquid crystal display;

FIG. 1C is a sectional view showing the active circuit transistor part of the third step of a conventional manufacturing method of transistors constituting the active circuit integrated liquid crystal display;

FIG. 1D is a sectional view showing the switching transistor part of the third step of the same.

DETAILED DESCRIPTION OF THE PREFERRED EMBODIMENTS

First, the first embodiment of the present invention will be fully described hereinafter referring FIGS. 3, 4A and 4B.

The procedures utilized up to the film deposition between layers and the heat treatment for activation of impurities follow the similar steps as the prior art (see FIGS. 1A to 1D). In FIGS. 4A and 4B, all parts having the same function as the corresponding part of the prior art are shown in the same numeral.

Figure 2A:
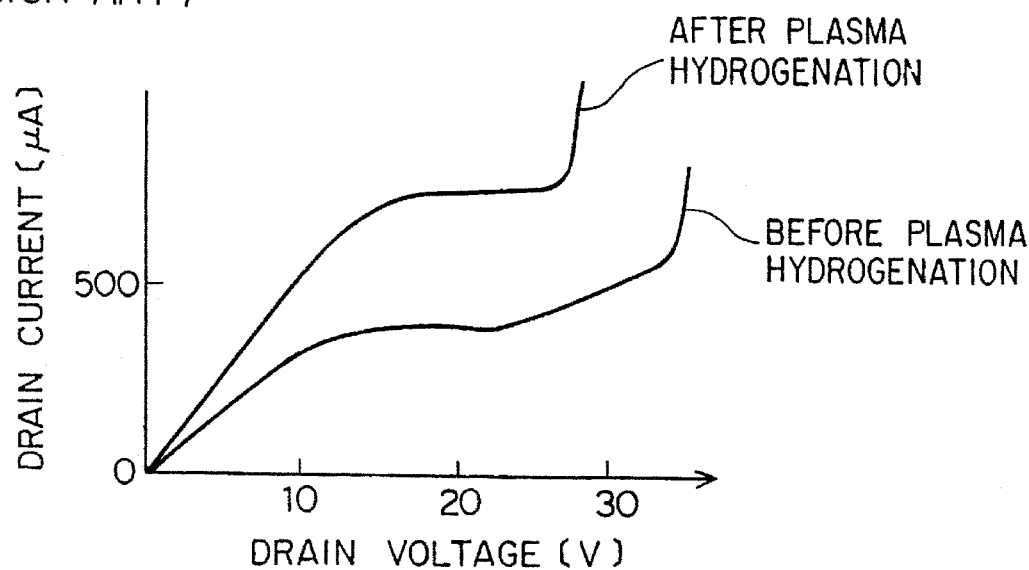
FIG. 2A is a graph showing the drain current—drain voltage characteristics of transistor constituting the conventional active circuit integrated liquid crystal display.
Figure 2B:
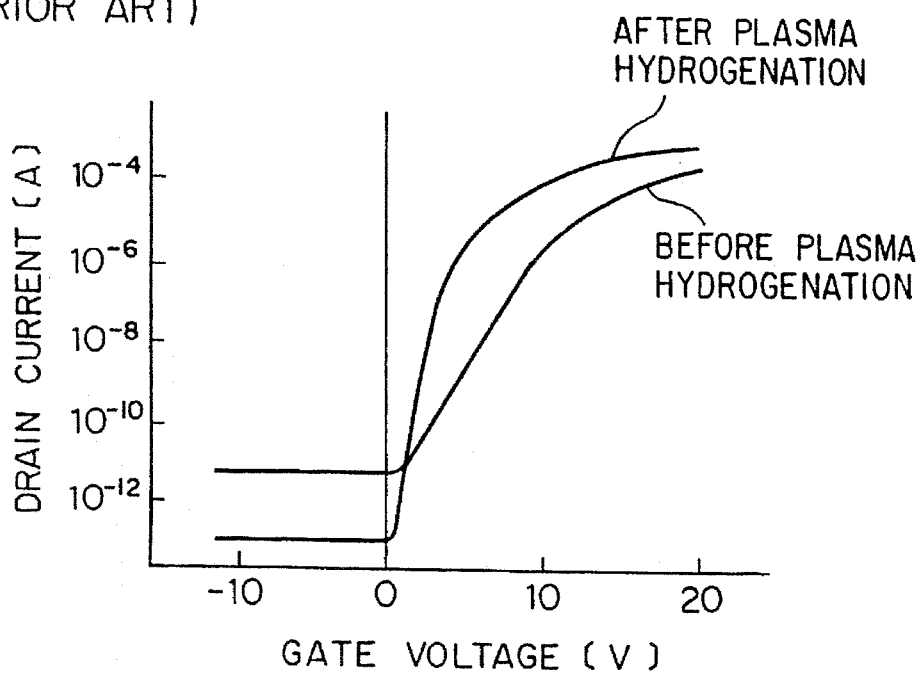
FIG. 2B is a graph showing the drain current—gate voltage characteristics of the N-type transistor of transistors constituting the conventional active circuit integrated liquid crystal display.
Figure 2C:
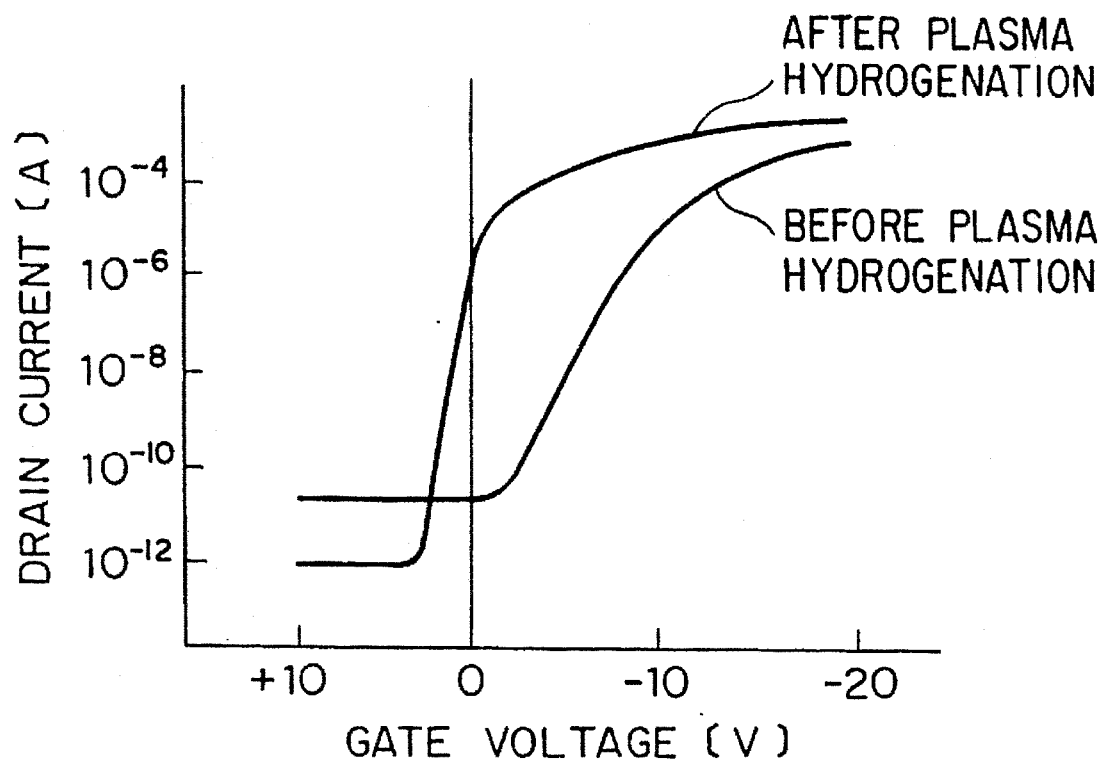
FIG. 2C is a graph showing the drain current—gate voltage characteristics of the P-type transistor of transistors constituting the conventional active circuit integrated liquid crystal display.
Figure 3:
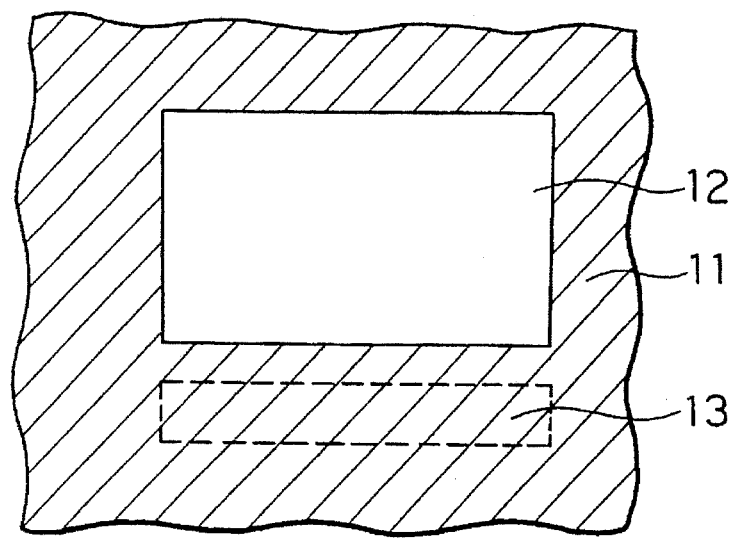
FIG. 3 is a top view showing the first step of the method of the first embodiment according to the present invention.

Then, as shown in FIG. 3, the aluminum film is formed by the sputtering, only the part of aluminum film immediately over the area on where the picture elements 12 was formed is removed by the patterning during the plasma etching step using the photoresist pattern to form the mask aluminum 11. In FIG. 3, numeral 13 is the area on where the active circuit element is formed.

Figure 4A:
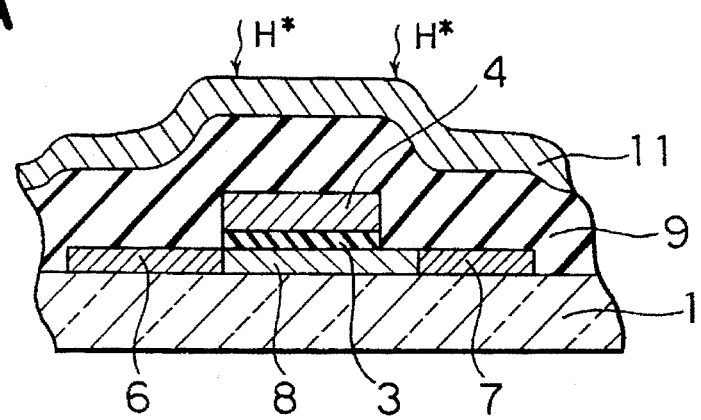
FIGS. 4A and 4B are a sectional view showing the active circuit transistor part and the picture element switching transistor part, respectively, of the second step of the same.
Figure 4B:
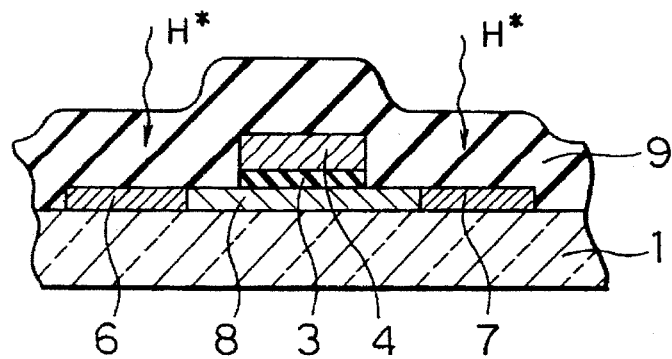

Subsequently, as shown in FIGS. 4a and 4B, plasma hydrogenation is performed, then the mask aluminum film 11 is removed by the etching.

Following the same steps as for the prior art thereafter, the active circuit integrated liquid crystal display is completed.

Figure 5:
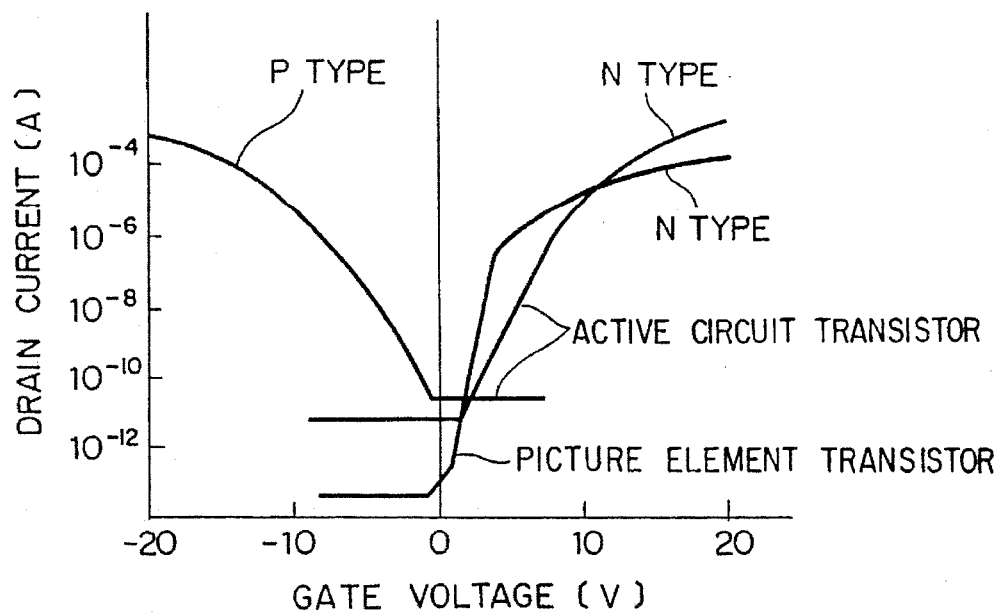
FIG. 5 is a graph showing the drain current—gate voltage characteristics of transistor constituting the active circuit integrated liquid crystal display fabricated according to the first embodiment shown in FIG. 3.

FIG. 5 shows the drain current—gate voltage characteristics of transistor constituting the active circuit integrated liquid crystal display fabricated according to the first embodiment. In this Figure, the characteristics of the N-type and the P-type transistors are shown for the active circuit transistor, and the characteristics of the N-type transistor are shown for the picture element transistor.

According to the method in this first embodiment, the trap-state density in the picture element transistor can be reduced so that the drain current can be reduced to about 0.05 pA as for the prior art as shown in FIG. 5.

In a transistor constituting the active circuit element, the mask aluminum film 11 formed on the transistor prevents the penetration of hydrogen so that the trap-state density in this part does not change. For this reason, as obvious from FIG. 5, the characteristics of a transistor constituting the active circuit element are similar to those of a transistor without plasma hydrogenation treatment. Therefore, the problems such as increase of the OFF-current and the like due to decreases of withstanding voltage between the source and drain and threshold voltage associating to the prior art can be avoided.

A method to reduce the trap-state density by plasma hydrogenation was shown in the first embodiment, however, there is another method available for hydrogenation of the picture element part or pixel region; that is, hydrogen ion is injected onto only the area on where picture element is formed using resist as mask, and hydrogen ion is dispersed by heat treatment at about 400° C. under hydrogen atmosphere. This method provides almost same effect.

Figure 6:
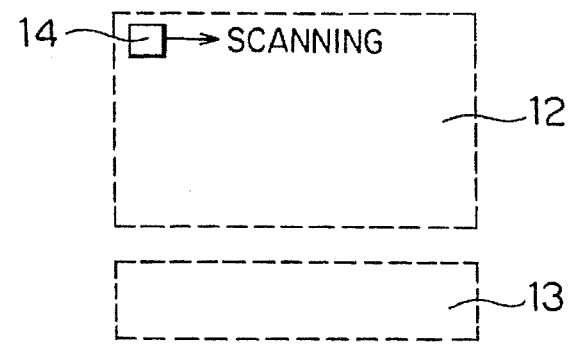
FIG. 6 is a top view of the second embodiment of the present invention.

FIG. 6 is a top view of the active circuit integrated liquid crystal display showing the second embodiment of the present invention. According to the prior art, polysilicon film is formed at about 100 nm thick on the transparent substrate and the active layer is formed by the patterning (see FIGS. 1A to 1D above).

As shown in FIG. 6, eximer laser light from XeCl eximer laser light source 14 is then radiated at the light intensity of 350 mJ/cm$^2$ onto only the picture element forming area 12 where a picture element transistor is formed. This light source 14 is scanned within the picture element forming region 12 and uniformly radiates eximer laser light onto the whole area of the picture element forming region 12. Thereby, polysilicon film constituting the active layer of the picture element part is selectively annealed and therefore its characteristics can be improved. The active circuit element forming region 13 is not scanned by the eximer laser light source 14.

Steps thereafter are the same as for steps of the prior art except for the plasma hydrogenation which is omitted from the process.

According to this second embodiment, by selective annealing of only polysilicon film constituting the active layer of the picture element part, crystallization can be improved, the characteristics of the picture element transistor can be improved, the leakage current can be reduced from 2 pA to approximately 0.3 pA.

On the other hand, since the active circuit element forming region 13 for constitution of the active circuit element is not radiated by the laser light, the trap-state density is higher than the picture element part, and the phenomenon such as decrease of the withstanding voltage between the source and the drain problematic in the prior art can be avoided.

Further, if the plasma hydrogenation step is added to the process in the second embodiment of the present invention in the same manner as the prior art, the leakage current of the picture element transistor can be reduced further to 0.01 pA.

In this connection, since crystallization of polysilicon is inferior to the picture element part, the trap-state density for a transistor constituting the active circuit element is higher than that of the picture element transistor, and the problem such as decrease of the withstanding voltage between the source and the drain is not serious compared to the prior art.

Figure 7:
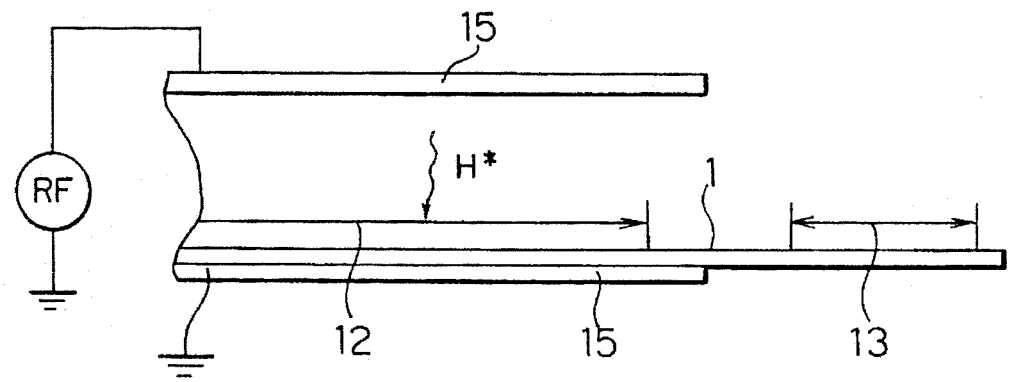
FIG. 7 is a side view of the third embodiment of the present invention.

FIG. 7 shows the third embodiment of the present invention and shows the hydrogenation treatment method. In this third embodiment, the steps up to the formation of the first aluminum electrode are same as for the steps used in the prior art.

In this third embodiment, the plasma hydrogenation equipment shown in FIG. 7 is used for the plasma hydrogenation treatment. In this plasma hydrogenation treatment equipment, a pair of electrodes 15 for generation of plasma is provided immediately over and below of the picture element forming area 12 on where the picture element is formed, and electrodes 15 are not located immediately over or below the active circuit forming area 13 where the active circuit is formed. Using this type of plasma hydrogenation treatment equipment, plasma hydrogenation is performed. The steps thereafter up to completion of the liquid crystal display are same as for the steps used in the prior art.

According to this third embodiment, since plasma is generated only nearby the picture element part of the picture element forming region 12 during the plasma hydrogenation treatment, the trap-state density can be reduced by selective introduction of hydrogen onto the picture element transistor. Further, similar to the first embodiment, the problem such as decrease of the withstanding voltage in the peripheral active circuit elements associated to the prior art can be avoided.

What is claimed is:

1. A method for manufacturing an active circuit integrated liquid crystal display having a switching transistor for a picture element and an active circuit element for activating the switching transistor on the same substrate, comprising the step of:

selectively performing plasma hydrogenation treatment for reducing the trap-state density of a polysilicon layer constituting an active layer of the switching transistor of the picture element, antransisitor constituting the active circuit element is masked prior to selectively performing plasma hydrogenation.

2. A method for manufacturing the active circuit integrated liquid crystal display according to claim 1, further comprising the step of:

selectively annealing at least a channel region of the switching transistor of the picture element by means of a plasma hydrogenation treatment device having an electrode located directly above, below, or above and below the picture element, wherein said electrode is not located above or below the active circuit element.

* * * * *